United States Patent [19]

Combs et al.

[11] Patent Number: 5,127,011
[45] Date of Patent: Jun. 30, 1992

[54] PER-PIN INTEGRATED CIRCUIT TEST SYSTEM HAVING N-BIT INTERFACE

[75] Inventors: Michael L. Combs, Poughquag; Algirdas J. Gruodis, Wappingers Falls; Dale E. Hoffman, Stormville; Charles A. Puntar, Hopewell Junction; Kurt P. Szabo, Fishkill, all of N.Y.

[73] Assignee: International Business Machines Corporation, Armonk, N.Y.

[21] Appl. No.: 464,473

[22] Filed: Jan. 12, 1990

[51] Int. Cl.$^5$ .......................................... G06F 11/00
[52] U.S. Cl. ..................................... 371/27; 371/22.1
[58] Field of Search ........................ 371/27, 22.1, 25.1; 324/73.1

[56] References Cited

U.S. PATENT DOCUMENTS

| | | | |
|---|---|---|---|
| 3,873,818 | 3/1975 | Barnard | 371/27 |
| 4,450,560 | 5/1984 | Conner | 371/27 |
| 4,517,661 | 5/1985 | Graf et al. | 371/27 |
| 4,608,706 | 8/1986 | Chang et al. | 377/39 |
| 4,639,919 | 1/1987 | Chang et al. | 371/27 |
| 4,656,632 | 4/1987 | Jackson | 371/27 |
| 4,682,330 | 7/1987 | Millham | 371/27 |
| 4,698,800 | 10/1987 | Cavaliere et al. | 370/24 |
| 4,724,378 | 2/1988 | Murray et al. | 371/27 |
| 4,727,312 | 2/1988 | Fulks | 371/27 |
| 4,775,977 | 10/1988 | Dehara | 371/27 |
| 4,806,852 | 2/1989 | Swan et al. | 371/27 |
| 4,931,723 | 6/1990 | Jeffrey et al. | 371/27 |

OTHER PUBLICATIONS

Branson, "Integrated Pin Electronics for a VLSI Test System," IEEE Transactions on Industrial Electronics, vol. 36, No. 2, May 1989, pp. 185-191.

Damm, "High Performance Gate Arrays," High Performance Systems, Jan., 1989, pp. 58-65.

Megaone VLSI Test System.

McArdle, "A 250 MHz Advanced Test System-System Software," 1987 International Test Conference, pp. 85-93.

Waicukauski et al., "Fault Detection Effectiveness of Weighted Random Patterns," Proceedings of International Test Conference, 1988, pp. 245-249.

Chang et al., "A 250 MHz Advanced Test System," IBM General Technology Division.

Grasso et al., "A 250 MHz Test System's Timing and Automatic Calibration," IBM General Technology Division.

Gruodis et al, "250 MHz Advanced Test Systems," IEEE Design and Test of Computers, 1988, pp. 24-35.

"Advantest T3340 General Purpose VLSI Test System Product Description", Publication No. 8021435-03 Revised 9/83, Takeda Riken America, Inc. (pp. 2-2-7-2-29).

Primary Examiner—Jerry Smith
Assistant Examiner—Russell Cass
Attorney, Agent, or Firm—Yen S. Yee

[57] ABSTRACT

Apparatus and method for controlling an operation of a test pin of a per-pin semiconductor device test system [10]. The apparatus includes pattern storage memory [42] for storing and for outputting information related to a state of the test pin for individual ones of a plurality of consecutive test cycles, pattern processor [14] having an input coupled to the pattern storage memory for generating for each of the test cycles words comprised of M bits, and a test pin control memory [18] having an input coupled to the output of the pattern processor for decoding each of the words into $2^M$ or less command words. Each of the decoded command words includes a plurality of control bits. Predetermined ones of the plurality of control bits are coupled to pin driver electronics [24,28] for specifying, for each of the test cycles, at least one characteristic of an electrical signal transmitted to the test pin. The test system also includes test pin signal receiving circuitry [26] for coupling to the test pin for receiving an electrical signal therefrom. Other predetermined ones of the control bits are coupled to the receiving circuitry for specifying, for each of the test cycles, at least one operating characteristic associated with the receiving circuitry.

31 Claims, 2 Drawing Sheets

PER-PIN INTEGRATED CIRCUIT TEST SYSTEM HAVING N-BIT INTERFACE

FIELD OF THE INVENTION

This invention relates generally to semiconductor device test systems known as per-pin test systems and, in particular, to a per-pin test system having for each pin an N bit interface for precisely specifying test signals generated by the pin.

BACKGROUND OF THE INVENTION

A generalized true per-pin test system is illustrated in FIG. 1. The per-pin test system has substantially identical circuitry dedicated to each of a plurality (n) of test pins to process test data going to a Device Under Test (DUT) and coming from the DUT. The system includes test pattern generating electronics, also referred to as a pattern generator, and test pin electronics for coupling to the DUT. The DUT may be, by example, an integrated circuit provided on a wafer comprising a plurality of identical circuits. The DUT may also be an integrated circuit provided on a wafer that comprises a plurality of dissimilar types of circuits. The DUT may also be a partially packaged integrated circuit having been previously scribed from the wafer. A controller, typically a data processor, is coupled to the test system through an interface for controlling the operation thereof.

Examples of per-pin test systems are described in a journal article "250-MHZ Advanced Test Systems", IEEE Design & Test of Computers, pps. 24–35, 1988 by A. J. Gruodis and D. E. Hoffman Additionally, reference is made to the following publications: Y. E. Chang, D. E. Hoffman, A. J. Gruodis, J. E. Dickol, "A 250 MHz Advanced Test System", Proceedings of International Test Conference", September 1987, pp. 68–75; J. M. McArdle, "A 250 MHz Advanced Test System Software", Proceedings of International Test Conference, September 1987, pp. 85–93; and L. Grasso, C. E. Morgan, M. S. Peloquin, F. Rajan, "A 250 MHz Test System Timing and Auto Calibration", Proceedings of International Test Conference, September 1987, pp. 76–84. Some commonly assigned U.S. Patents that disclose aspects of test systems include U.S. Pat. No. 4,639,919, Jan. 27, 1987 and U.S. Pat. No. 4,608,706, Aug. 26, 1986.

In a true per-pin test system, there are identical sets of pattern generator and test pin electronics provided for each of the tester system pins. In most, if not all, embodiments it is advantageous to physically divide the test system into a pattern generator module and into a pin electronics module, wherein the pin electronics module is disposed closely adjacent to the DUT to minimize signal delays and is electrically interconnected by cables to the typically much larger pattern generator module. The pattern generator module stores the test pattern control data, processes the outgoing test data, performs algorithmic test pattern generation, and processes the data that returns from the pin electronics module. The pin electronics module receives the test data and converts the data into electrical signals that interface through a plurality of test pins to the DUT. The pin electronics module in operation performs a number of subsidiary tasks including (a) varying a logical value, format and functional mode of the applied test data on a per-pin basis, (b) varying voltage levels sent to or expected from the DUT on a per-pin basis, and (c) varying the signal edge timings of the pin on a per-pin basis.

In high performance and high accuracy semiconductor device test systems such per-pin control is highly desirable and provides several advantages. For example, even small variances between a pin's wiring and electronics may cause unacceptable degradations in the signal quality or timing. Although care is given to the design of test systems to minimize per-pin differences and circuitry is also often included to match separate sets of pin electronics, in high performance test systems these approaches still do not guarantee a required level of uniform performance from pin to pin. Presently known types of test systems furthermore have only a relatively small set of selectable fixed signal timings, thereby limiting the number of conditions that can be specified. Also, many test systems have only a limited number of available voltage levels, thereby limiting the range and choice of voltages.

Thus, although a highly flexible per-pin specification capability is necessary to maintain a uniformity of test stimuli amongst a possibly large number of test pins, known types of test systems do not provide an adequate per-pin test specification capability that satisfactorily overcomes the tester deficiencies resulting from pin variability and other related problems. One reason for this lack of pin programmability is related to the required physical separation of the pin electronics module and the pattern generator electronics module. In that it is practical to provide only a relatively few interconnections between the modules for each pin, only a corresponding limited number of pin states can therefor be specified. The tendency of modern testers to increase the number of test pins further limits the number of per-pin interconnects that can be provided.

Also, many conventional test systems, in order to make a change in format, timing or voltage conditions of a pin driver, require that the test system be placed into a wait state while the pin's condition is reprogrammed. In test programs of typical complexity such pin reprogramming occurs many times during the test program. As a result, the time delay incurred for each system wait state is incremental, resulting in a significant throughput loss.

Furthermore, a general purpose test system for VLSI must be capable of efficiently testing, at the chip or the module level, sequential and combinatorial logic, storage arrays such as Read Only Memory (ROM), and Random Access Memory (RAM) arrays embedded in logic. In that VLSI chips containing logic are preferably designed with Level Sensitive Scan Design (LSSD) shift register techniques to enhance testability, the ability to test embedded memory and also LSSD structures must be supported by the test system.

Also, for very high levels of integration or for multi-chip modules the number of data vectors (X) that are required to test the product with a high level of test coverage becomes large. To eliminate the need to generate, transport/transmit, and store this large quantity of data, Weighted Random Pattern (WRP) testing with signature analysis at the DUT output pins is employed. WRP testing is described by J. A. Waicukauski and E. Lindbloom in "Fault Detection Effectiveness of Weighted Random Patterns", Proceedings of International Test Conference, 1988, pp. 245–249. As such, the provision of a test system that readily implements both deterministic and WPR testing is desirable.

In a journal article by C. W. Branson, "Integrated Pin Electronics for a VLSI Test System", IEEE Transactions on Industrial Electronics, Vol. 36, No. 2, May 1989, pp. 185–191 there is described test pin electronics circuitry. A 256×4 pattern memory is said to exist for each tester pin. In a journal article "High Performance Gate Array", High Performance Systems, January 1989, W. Damm describes a verification tester that is said at page 62 to include 16-word register files for storing timing information that is changed on a vector-by-vector basis. In a description of a Megaone VLSI Test System (undated) each test pin is said to have 64 independent waveforms selected on the fly.

In U.S. Pat. No. 4,775,977, Oct. 4, 1988, entitled "Pattern Generating Apparatus", Dehara discloses a pattern generator for testing integrated circuit devices. A pattern memory 1A has a two bit output applied to both a driver pattern generator 1C and an expected pattern generator 1D. When an output of an IO memory 1B is a logic "1" the driver pattern generator generates a combination of waveforms in dependence on the two bit output from pattern memory 1A. When an output of the IO memory 1B is a logic "0" the expected pattern generator 1D decodes the two bit output to generate an expected pattern. This technique is said to allow a driver pattern having a waveform corresponding to a given combination of different waveforms to be generated in synchronism with a timing signal and to also simplify testing the integrated circuit for a high impedance output condition. However, this teaching of Dehara appears to be limited to interconnections made between units normally associated with pattern generating devices. As a result, the teaching of Dehara does not alleviate, either singularly or in combination with the other references set forth above, the problem of specifying a large number of pin-states or pin-conditions, such ac formats, edge timing, driver voltage levels, receiver threshold levels and receiver strobe timing on a per-pin, per cycle, basis with a relatively small number of readily implemented interconnections made between a pattern generator module and a pin electronics module.

It is therefore an object of the invention to provide a true per-pin test system wherein a selectable number of N bits are employed to precisely control signals applied to a DUT and to precisely specify signal states expected to be received from a DUT.

It is another object of the invention to provide a true per-pin test system that eliminates a requirement that the system be placed in a wait state in order to change a pin format or other condition during a test in that a large number of pin states are preprogrammed into the tester prior to the test, with the changes of state occurring on the fly during testing.

It is a further object of the invention to provide a true per-pin test system that readily accommodates additional pin drive and/or receive functionality by increasing a width of a pin function control word generated from a relatively few and fixed number of signal lines provided from a test pattern generator.

It is a further object of the invention to provide a true per-pin test system having a large number of programmable pin states for efficiently testing embedded memory arrays and also LSSD structures, the test system readily accommodating both deterministic and WRP test methodologies.

SUMMARY OF THE INVENTION

The foregoing problems are overcome and the objects of the invention are realized by method and apparatus for specifying test signals presented to and expected from a DUT, with a high degree of flexibility, very high precision, and with no performance degradation in a true per-pin architecture test system.

In accordance with the invention there is provided in a per-pin semiconductor test system, having a plurality of test pins expressed as ($P_{total}$), circuitry coupled to each test pin for providing the system with a total possible number of test pin conditions given by $(2^M)^{P_{total}}$ wherein M is an integer and is expressive of a number of active interconnects coupled between a test pin pattern generator and test pin driver/receiver electronics.

Further in accordance with the invention there is provided apparatus for controlling an operation of a test pin of a semiconductor device test system. The apparatus includes pattern and control storage memory for storing and for outputting information related to a state of the test pin for individual ones of a plurality of consecutive test cycles. The apparatus further includes a pattern processor that uses up to N bits of data from the storage memory for every cycle to produce M bits/cycle (where $M \geq N$). The apparatus further includes a pin control decoding memory having an input coupled to the output of the pattern processor for decoding each of the M-bit words into command words, each command word including a plurality of control bits. Predetermined combinations of the plurality of control bits are coupled to pin driver circuitry for specifying, for each of the test cycles, at least one characteristic of an electrical signal transmitted to the test pin. The test system also includes test pin signal receiving circuitry for coupling to the test pin for receiving an electrical signal therefrom. Other predetermined combinations of the control bits are coupled to the receiving circuitry for specifying, for each of the test cycles, at least one operating characteristic associated with the receiving circuitry.

Characteristics associated with the electrical signal transmitted to the test pin that are specified by the control bits include, but are not limited to, a logical state of the test pin, a pulse format and timing applied to the test pin, a voltage magnitude and polarity of the test pin, and whether a test pin driver is in an "on" state, an "off" state, or in a third state that properly terminates the signal from the DUT.

Characteristics associated with the receiving circuitry that are specified by the control bits include, but are not limited to, an expected logical state of the test pin at the time the pin is sampled, a magnitude of a voltage threshold associated with the test pin receiver circuit, a time at which an output of the test pin receiver circuit is sampled and a position of a timing window wherein the output of the test pin receiver circuit is tested for an occurrence of a signal excursion.

BRIEF DESCRIPTION OF THE FIGURES

The above set forth and other features of the invention are made more apparent in the ensuing Detailed Description of the Invention when read in conjunction with the attached Figures, wherein.

DETAILED DESCRIPTION OF THE INVENTION

The following description of a presently preferred embodiment of the invention is made in the context of a true per-pin test system having a typical operating frequency of 250 MHZ and a test cycle period of four nanoseconds. The system includes 320 test pins expandable in increments of 320 pins, each pin including a 32 Mbit pattern generation buffer memory. The test system is optimized for the testing of logic devices and embedded memory arrays through both deterministic and weighted random testing methodologies. Test pin format types supported include Non-Return to Zero (NRZ), Return to Zero (RZ), Delayed Non-Return to Zero (DNRZ), Return to One (R1) and Force One or Zero (F1/0), all of which may be changed on the fly. The system further includes six timing generators per-pin which may also be changed on the fly. The voltage range of pin drivers and receivers is $-3/+5$ volts with each pin having two receivers associated therewith. The test system is optimized for testing logic levels associated with several logic family-types and is further optimized, by including two receivers per-pin, for testing bi-directional transceiver circuits such as that disclosed in commonly assigned U.S. Pat. No. 4,698,800, issued on Oct. 6, 1987 to J. R. Cavaliere et al. It should be realized however that the teaching of the invention is applicable to a variety of per-pin architecture test systems constructed to have characteristics other than those disclosed herein.

Figure 1:
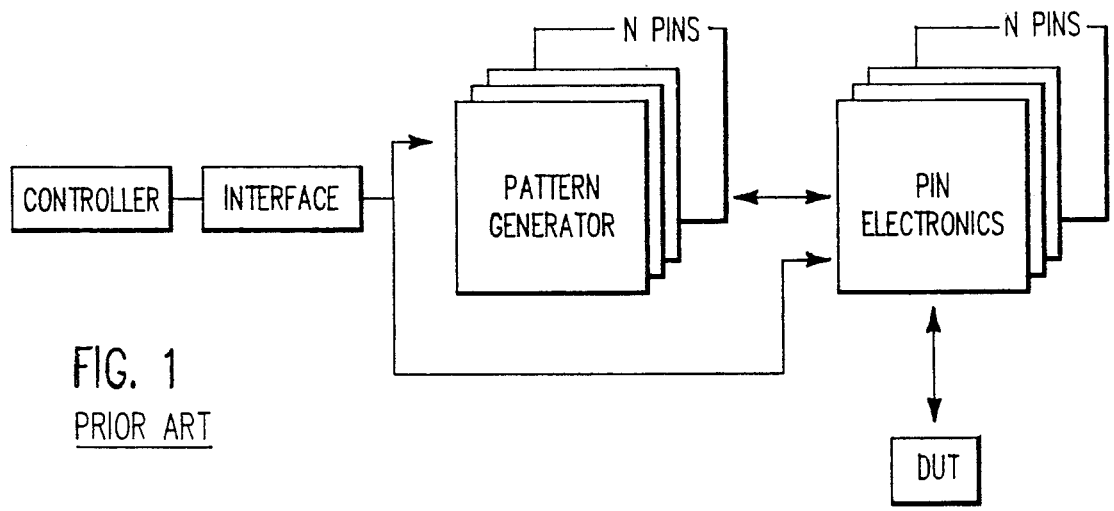
FIG. 1 is a simplified block diagram showing a per-pin test system of the prior art.
Figure 2:
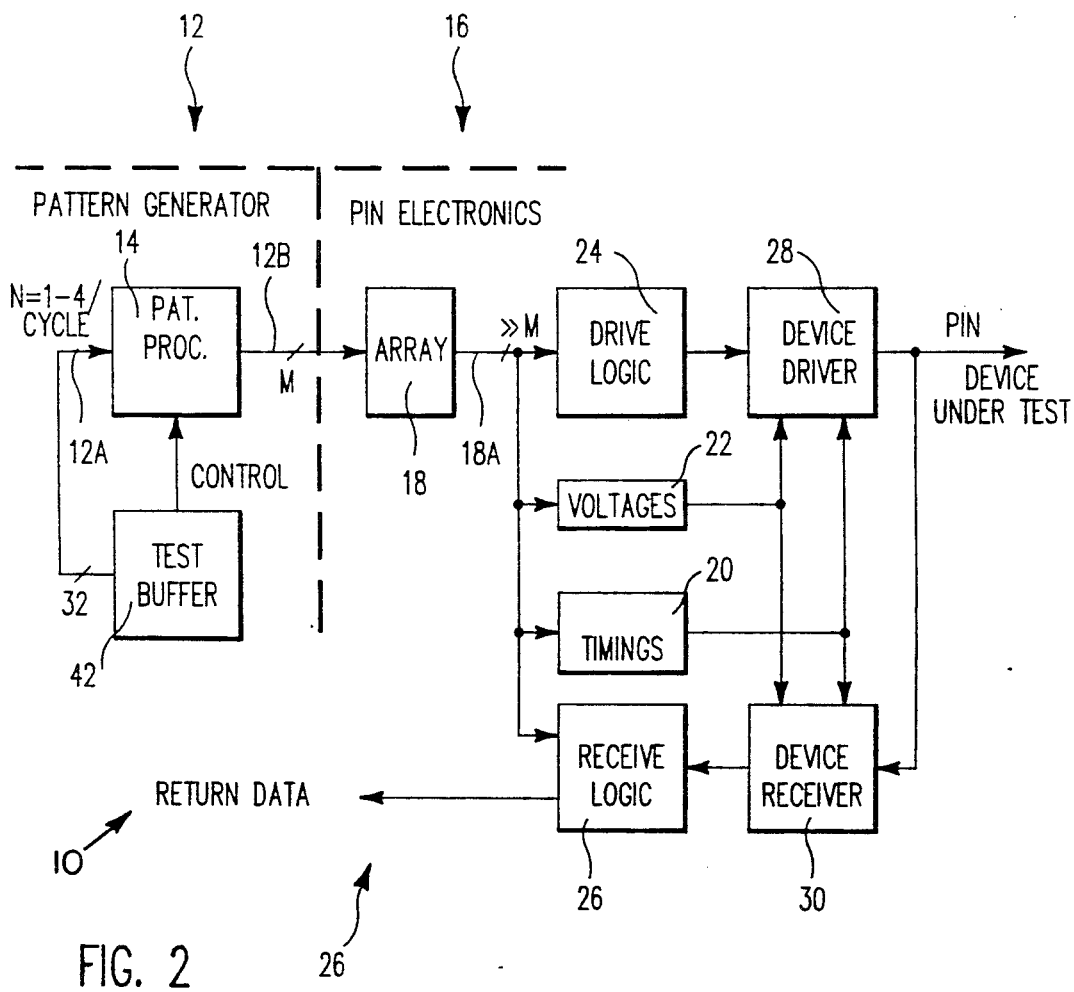
FIG. 2 is a block diagram illustrating a presently preferred embodiment of pattern generator electronics, pin electronics and the interface therebetween.

Referring to FIG. 2 there is illustrated a portion of a true per-pin semiconductor test system 10 constructed and operated in accordance with the invention. A Test Buffer 42 supplies up to N-bits per-pin of data for every test cycle. In a deterministic test mode there is at least one bit used per cycle and possibly up to $N(1-N)$ bits per cycle. In accordance with an aspect of the invention the actual number of N-bits is programmable with the number of bits used per test cycle being contained in pattern data stored or generated within a Pattern Generator 12. When run in an algorithmic generation mode the data is treated as commands and the number of bits used per cycle may be less than 1. Control for these functions is provided on a per-pin basis to maintain flexibility and independence of test pins. The Pattern Processor 14 uses the variable number of N-bits and combines this with a set of fixed (M−N) bits to be sent to the Pin Electronics 16. A constant number of output bits (M) are sent to the Pin Electronics. In accordance with an aspect of the invention the maximum value of N determines a number of unique states that can be specified while the value of M gives an upper limit to this number of states. In a presently preferred embodiment of the invention N may equal from one to four bits while M equals four bits, although other values are within the scope of the invention. In general, as the number of bits per test cycle used by the Pattern Generator 12 increases the number of specifiable combinations also increases. Conversely, as the number of bits per test cycle is reduced the amount of memory required to specify these cycles is also decreased. In that different test applications require different amounts of DUT signal specification it is desirable to optimize the amount of specification required for a given application without expending more stored data than is necessary. As a result, the teaching of the invention makes the ratio N/M a variable, thereby providing the ability to minimize the data produced and stored in the Pattern Generator 12 while providing a required degree of DUT signal specification for a given testing application.

The M bits comprise a per-pin interface between the Pattern Generator 12 and the Pin Electronics 16. The information conveyed by the M bits controls the Pin Electronics 16 interface to the DUT and provides the test system 10 with a per-pin, per test cycle control over pin conditions such as timing, pin formats, common I/O and comparator operations. The M bits are logically decoded to define and control the test pin condition for a given test cycle; that is, the operation and selection of timing generators, the operation of receiver comparators, the expected data processing, the pin driver's functional characteristics and other pin-related conditions. In operation, the Pin Electronics 16 includes a memory array 18 that is addressed by the M-bit interface. The array 18 produces a pin control word 18a comprised of a plurality (typically $>>M$) of output bits for specifying controlling values to timing units 20, controlling values to pin voltage units 22 and the drive and receive logic 24 and 26 for specifying pin formats. The array output bits 18a specify controlling bits to the drive electronics such as control for common input and output operations and a device driver 28 "on" or "off" state. In this manner the array 18 controls the desired data formats, the desired timing edge placement, the desired driver function, and the desired DUT data on a test cycle by test cycle basis. The bits of the control word 18b are also available to process the data returned from the device receivers 30 through the comparators of the receive logic 26. It can thus be realized that by initially specifying and storing the data within the array 18, it being remembered that the array 18 is associated with but a single pin of the test system 10, the signals produced by the Pin Electronics 16 are precisely controlled and, furthermore, the processing of data returned from the DUT to the pin is precisely defined.

Furthermore, the invention does not require that any programmable elements be dependant on outside control during normal operation, thereby releasing the system 10 to operate at an uninterrupted full speed. In contradistinction conventional test systems, in order to make a change in format, timing or voltage conditions of a pin driver, require that the system be placed into a wait state while the pin's condition is reprogrammed. In test programs of typical complexity such pin reprogramming occurs many times during the test program. As a result, the time delay incurred for each system wait state is incremental resulting in a significant throughput loss. The teaching of the invention advantageously eliminates the requirement that the system be placed in a wait state in that a relatively large number ($2^M$) of pin conditions can be preprogrammed into the pin electronics prior to the test, with the changes of state occurring on the fly during the test.

Figure 3:
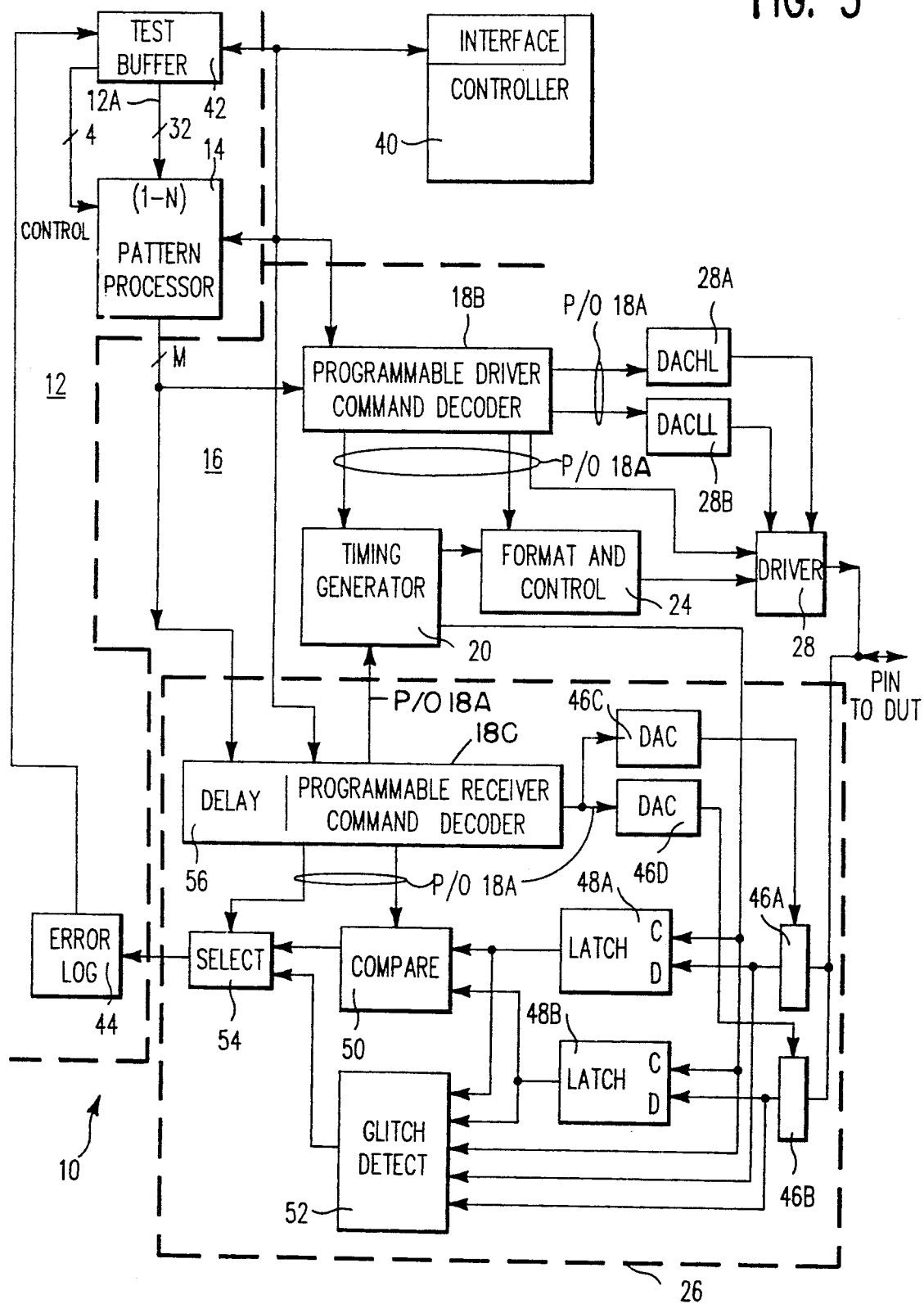
FIG. 3 is a block diagram showing in greater detail a bidirectional interface between the DUT and the test system of the invention.

Referring now to FIG. 3 there is shown in greater detail the test system 10 of the invention, specifically the Pattern Generator 12 and the Pin Electronics 16 associated with one pin of the test system 10. Also shown is a controller 40 coupled at least to the Test Buffer 42 and the Array 18, the Array 18 being shown in greater detail as a Programmable Driver Command Decoder 18b and a Programmable Receiver Command Decoder 18c. The controller 40 in a presently preferred embodiment of the invention is a data processor known in the art as a PS/2 processor manufactured by International Business Machines Corporation. It should be realized, however, that a number of suitable controlling devices could be so employed. The controller 40 is coupled via a suitable interface at least to the aforementioned Test Buffer 42 and Array 18 for storing data therein for specifying the various test cycles and the pin state for each test cycle. The interface may take the form of address and data multiplexers for providing the Controller 40 with access to these programmable elements The Test Buffer 42 includes a 1M×36 bit DRAM block that feeds into a 36 bit wide FIFO prefetch buffer. The Test Buffer 42 may further include memory-associated support circuitry such as Error Detection and Correction logic, data and address buffers, DRAM refresh control logic and similar conventional circuitry. Controller 40 writes test vector information into the Test Buffer 42 before a test and reads test-related failure information from the Buffer 42 after the test, the failure information being provided from an Error Log 44 as will be described. Controller 40 also writes appropriate data to the Array 18 for specifying pin conditions for the test. In accordance with the invention the Pattern Processor 14 also includes data format circuitry for formatting 32 bits of DRAM output into a sequentially provided series of test words from one to four bits in width, thus employing for each test cycle up to N of the bits. The remaining 4 bits of the 36 bits of DRAM data form a CONTROL signal and are used to control the above mentioned format circuitry.

That is, in this embodiment of the invention the Test Buffer 42 provides 32 bits of stored information to the Pattern Processor 14 and also provides four bits of associated CONTROL information. The 32 bits represents a minimum of eight test cycles, each test cycle thus having four bits for specifying test conditions. In accordance with an aspect of the invention the CONTROL input to the pattern processor 14 specifies up to 16 different decodings of the 32 bit input. For example, the CONTROL input may specify a code of $0_{16}$ to indicate that the 32 bits are to be divided into eight test cycles, each test cycle being represented by four bits. In this case for any one of the eight test cycles the state of the M bits may reflect the state of the corresponding N bits of the 32 bit input. A code of $1_6$ may indicate that the 32 bits represent 16 test cycles having two bits per cycle. In this case the Pattern Processor 14 provides two variable and two fixed bits as the M bits. Further by example another code indicates that algorithmic pattern generation is in effect and that the 32 bits are to be considered as algorithmic instructions. That is, for algorithmic processing the 32 bits are differentiated into fields with one field specifying, by example, a pin state and another field specifying a number of loops or iterations to be executed with the test pin applying the specified pin state.

As was stated, the bits 12a are appended to (M−N) fixed bits, where the number of output bits (M) determines the total number of states ($2^M$) that are available at any one pin to test the DUT. As was also previously stated, in the presently preferred embodiment of the invention M equals four for specifying during a test sequence up to 16 different pin states.

The programmable timing generator 20 provides a number of timing pulses whose position can be altered in response to control signals. In a simplest embodiment the programmable timing generator 20 includes several sources of timing pulses each having an output line buffered by a multiplexor whose inputs are connected to each of the sources, while the select signals are connected to the control lines. In this manner the change of the control line status shifts the output pulses to new positions.

Another alternative for changing the timing position is to directly couple the control lines from the command decodes to the timing generators.

The Array 18 is comprised of two sections, specifically the Programmable Driver Command Decoder 18b and the Programmable Receiver Command Decoder 18c. Decoder 18b is employed to decode the M-bit control word from pattern processor 14 to control pin driver functions while Decoder 18c decodes the same M-bit control word to control receiver functions. In a simplest form Array 18 is a high speed RAM device where the M-bit control word is used as the address input. The width of the RAM is such that all necessary signals for controlling all pin-related functions are produced simultaneously and in parallel as the control word 18a. The depth of the RAM is less than or equal to $2^M$ and determines the maximum number of states that can be programmed for any one pin during a single test. As was stated, in the presently preferred embodiment the depth is 16 words. The Decoder 18b outputs are divided into two groups. A first group is applied to Timing Generator 20 and controls timing edge selection for driver pulse start and stop, and also a time at which to switch to a third driver state. A second group of Decoder 18b outputs drives the Format and Driver Status Control Logic 24. The information that is conveyed by this second group of output lines determines the format (RZ, NRZ, DNRZ, R1, etc.), the type of data (1,0) and whether the driver is on (drive one or drive zero) or in a third state.

The Receive Logic block 26 of FIG. 3 is indicated in dashed outline and can be seen to include a number of components. The Programmable Receiver Command Decoder 18c is similar in structure to the Programmable Driver Command Decoder 18b described above but instead operates to control the status of the Receivers 46a and 46b, determine the timing to be applied to received data latches 48a and 48b, the expected data from the DUT for comparison with the actual DUT output by comparator 50, select a type of test (level, 'glitch' or receivers off), define a time window for a 'glitch' or transient detector 52, as well through a select multiplexer 54 to select a mode of error detection and to inhibit error logging if the pin is used as a drive pin only during a current cycle.

The type of receiver preferred for the test system 10 is a high gain differential amplifier wherein the signal from the DUT is connected to a positive input and a reference voltage is connected to a negative input. The output of the amplifier is essentially a binary output (i.e. either a high or a low output). In this manner whenever the DUT output exceeds the reference voltage the output is high and when the DUT input falls below the reference the output is low.

As was previously mentioned a minimum number of Receivers 46a and 46b for an efficient test of bidirectional-type drivers is two. However, it is within the scope of the invention to provide more than two receivers if simultaneous testing of several parameters is desired. Also, under most test conditions the receiver 46a and 46b reference voltage can remain at fixed levels. However, it is within the scope of the invention to couple Digital to Analog Converters (DACs) 46c and 46d between the Programmable Receiver Command Decoder 18c and the Receivers 46a and 46b. The DACs 46c and 46d have a plurality of digital inputs coupled to a corresponding portion of the control word 18a for specifying, on a per cycle basis, the magnitude of each DAC output voltage and thus the magnitude of the associated receiver reference level. In both of the above mentioned embodiments the teaching of the invention readily accommodates the additional functionality by simply increasing the width of the memory used for receiver decoding to generate the required additional receiver control lines.

Latches 48a and 48b capture the output state of the associated receiver 46a and 46b, respectively, at a desired strobe time. After the receiver data is captured there is sufficient time to compare in Comparator 50 the DUT signal with the expected data generated by the Programmable Receiver Command Decoder 18c. The position of the strobe is controlled by the Timing Generator 20 in response to a control signal that forms a part of the control word 18a generated by the Programmable Receiver Command Decoder 18c.

Glitch Detector 52 is employed to detect any switching activity within a predefined time window. The Glitch Detector 52 has an input coupled to the Timing Generator 20 and operates as follows. At the beginning of the window the status of each of the receivers 46a and 46b is latched. For the duration of the window the latched receiver output is compared to a time dependent output of the Receivers 46a and 46b by means of an Exclusive-Or logic function. The output of the Exclusive-Or function is employed to drive a gated set input of a set-reset latch. This gate is enabled for the duration of the window. At the end of the test cycle the status of the latch is tested and subsequently reset. If the set-reset latch is found to be set it is indicated that there occurred an excursion of the DUT signal from the state as captured at the beginning of the time window.

Further in accordance with the invention the Receiver 26 includes a Digital Delay 56 that imposes a predetermined delay on the M bit address input to the Programmable Receiver Command Decoder 18c. As a result, the receiver portion of the command word 18a is generated later in time than the driver portion of the command word 18a. The length of the delay time imposed by Digital Delay 56 is selected to compensate for signal propagation delays between the DUT and the pin electronics. In that the round trip signal propagation delay may be approximately six nanoseconds, for a typical DUT-Pin electronics spacing, while the test cycle time at 250 MHZ is only four nanoseconds, the Digital Delay 56 operates to maintain signals returned from the DUT in synchronism with the test timing.

The Error Log 44 provides a mechanism for recording the occurrence of a test cycle producing an error, that is, recording during which test cycle(s) the DUT output deviated from a predicted output. In a presently preferred embodiment Error Log 44 includes a RAM having an address that is incremented on every cycle and a corresponding RAM location written with the output of the Select Multiplexer 54. Alternately, additional logic is provided for incrementing and writing the RAM only when an error condition is indicated.

The Error Log 44 contents are subsequently transferred to the memory in Test Buffer 42 and read out by the Controller 40 for off-line analysis to determine if a failure is recorded.

The Format and Control Block 24 performs pin formatting and driver control. In the simplest embodiment Block 24 includes a set-reset latch wherein applicable bits of control word 18a gate timing pulses to both the set and reset lines. By example, to produce a RZ (return to zero) pulse with "one" data, the logic directs a start pulse timing signal to the latch set input and an end pulse timing signal to the latch reset input. In a similar fashion all formats with one and zero data can be described and the logic necessary to accomplish the function generated.

The Driver 28 includes two time dependent inputs. The first of these inputs determines if the Driver 28 is enabled to respond to the second input or whether the Driver 28 will remain in its third state independent of the state of the second line. The output of the Driver 28 goes to the Receivers 46a and 46b and through the pin to the DUT. In addition to the time dependent signals there are two additional control lines (not shown in FIG. 3) which determine the output high and output low voltage levels. In the presently preferred embodiment of the invention the voltage levels are predefined before the test and remain constant during the test. In other embodiments of the invention however these output high and output low voltage levels are variable on a test cycle by test cycle basis. To accomplish this additional functionality a pair of DACs, specifically a DAC High Level (DACHL) 28a and a DAC Low Level (DACLL) 28b, are coupled between the Programmable Driver Command Decoder 18b and the Driver 28. Each of the DACs 28a and 28b has a plurality of digital inputs coupled to a corresponding portion of the control word 18a for specifying, on a per cycle basis, the magnitude of the DAC output voltage. Again, the teaching of the invention readily accommodates this additional functionality by increasing the width of the RAM used for driver decoding to generate the required additional driver control lines.

As explained above, the Pattern Processor 14 reads out the required M bits/pin/cycle sequentially to execute all required test steps. However, for a general purpose tester, this implementation can impose a limitation since embedded memory array testing and LSSD logic testing require a large number of test cycles. Thus, in that embedded memory array and similar test patterns are regular in structure, they can be generated algorithmically as described at pages 26–28 in the previously mentioned journal article "250-MHZ Advanced Test Systems", IEEE Design & Test of Computers, 1988 by A. J. Gruodis and D. E. Hoffman.

The testing of LSSD shift registers further requires that some pins have the capability to provide large strings of pseudo-random data. This is a consequence of LSSD design and test generation. Tester pins requiring this capability are those coupled to LSSD Shift Register data In (SRI) and data Out (SRO) pins. For example, if for proper test of the logic X test vectors are required to be applied to the logic, and if the length of the LSSD shift register string is Y, then the SRI and SRO pins will require XY test cycles. Similarly, the LSSD shift clocks A and B require the same amount of data. However, since the clocks are repetitive, they can be generated algorithmically. In general, the same algorithmic capabilities used for address and data generation when testing memory arrays can also be used for generating the LSSD shift clocks.

Those tester pins associated, during a particular test, with LSSD functions (SRI, SRO, shift clocks A and B) as mentioned above require a substantial amount of data during the test. However, there is no requirement for the format nor the timing to change from cycle to cycle in that the test involves loading and clocking the LSSD shift register. For this reason the tester of the invention stores or generates only one bit of data per test cycle to be used to drive the LSSD associated test pins. The remaining, unused lines of the M bits at the output of Pattern Processor 14 can be forced to a fixed, or inactive, state. In this manner no physical change is required in the Decoders 18b and 18c driven by the M bits, yet the amount of control word 18 related data required to be stored before the test by the Controller 40 within the system 10 is decreased significantly.

It can be seen that the invention provides in a per-pin semiconductor test system, having a plurality of test pins expressed as ($P_{total}$), circuitry coupled to each test pin for providing the system with a total possible number of test pin conditions given by $(2^M)^{PTOTAL}$, wherein M is an integer and is expressive of a number of active interconnects coupled between the test pin pattern generator and the test pin driver/receiver electronics. For example, assuming a pin complement of 1024 the resulting number of specifiable pin conditions is $16^{1024}$ based on M being equal to four active signal interconnects. For the case described above wherein only one of the M interface lines is active, such as when performing algorithmic testing, the number of specifiable system pin conditions is $2^{1024}$.

While the invention has been particularly shown and described with respect to a preferred embodiment thereof, it will be understood by those skilled in the art that changes in form and details may be made therein without departing from the scope and spirit of the invention.

Having thus described our invention, what we claim as new, and desire to secure by Letters Patent is:

1. Apparatus for controlling an operation of a test pin of a semiconductor device test system, comprising:

means for storing and for outputting information related to a state of the test pin for individual ones of a plurality of consecutive test cycles;

means, having an input coupled to the storing means, for generating words at an output thereof for each of the test cycles, each of the words being comprised of M bits of stored data;

means, having an input coupled to the output of the generating means, for decoding each of the words into one of $2^M$ control words each of which includes a plurality of control bits, predetermined ones of the plurality of control bits being coupled to pin driver means for specifying, for each of the test cycles, at least one characteristic of an electrical signal transmitted to the test pin;

test pin signal receiving means for coupling to the test pin for receiving an electrical signal therefrom, the decoding means having predetermined ones of the control bits coupled to the pin receiving means for specifying, for each of the test cycles, at least one operating characteristic associated with the pin receiving means;

wherein the semiconductor device test system includes a plurality of test pins, each of the test pins having associated therewith one of the storing means, generating means, and decoding means; and the apparatus further including interface means for coupling, to controller means, an input of the storing means, generating means, and decoding means associated with each of the test pins, whereby the controller means stores information within each of the storing means, generating means, and decoding means, prior to execution of the plurality of test cycles, for independently specifying an operation of each of the associated test pins of the semiconductor device test system.

2. Apparatus as set forth in claim 1 wherein the electrical signal characteristic is expressive of a logical state of the electrical signal.

3. Apparatus as set forth in claim 1 wherein the electrical signal characteristic is expressive of a pulse format of the electrical signal.

4. Apparatus as set forth in claim 1 wherein the electrical signal characteristic is expressive of a voltage magnitude of the electrical signal.

5. Apparatus as set forth in claim 4 and further comprising Digital to Analog Converter means having inputs coupled to predetermined ones of the control bits and further having a variable voltage output coupled to the pin driver means.

6. Apparatus as set forth in claim 1 wherein other predetermined ones of the plurality of control bits are coupled to the pin driver means for specifying, for each of the test cycles, whether the pin driver means is in an "on" state, an "off" state, or in a third state.

7. Apparatus as set forth in claim 1 wherein the test pin signal receiving means is comprised of a first pin receiver circuit and a second pin receiver circuit each having an input coupled to the test pin.

8. Apparatus as set forth in claim 7 wherein the operating characteristic associated with the pin signal receiving means is a magnitude of a reference voltage signal applied to each of the first and the second pin receiver circuits.

9. Apparatus as set forth in claim 8 and further comprising a first Digital to Analog Converter means and a second Digital to Analog Converter means each having inputs coupled to different predetermined ones of the control bits and a variable voltage output coupled to an associated one of the pin receiver circuits for providing the reference voltage signal thereto.

10. Apparatus as set forth in claim 1 wherein the operating characteristic associated with the pin receiving means is a predicted logical state of the test pin at a specified time in the test cycle.

11. Apparatus as set forth in claim 10 and further comprising a first pin receiver latch means and a second pin receiver latch means each of which has a data input coupled to an output of an associated one of the pin receiver circuits and a strobe input coupled to timing generation means for latching the output of the associated pin receiver circuit in accordance with the strobe input.

12. Apparatus as set forth in claim 11 wherein the timing generation means has a control input coupled to a predetermined one or ones of the control bits and is responsive thereto for generating one or more timing signals at a desired point during the test cycle in accordance with information expressed by the one or more control bit inputs.

13. Apparatus as set forth in claim 12 wherein the pin signal receiving means further comprises means for detecting a deviation of a received pin signal away from a predetermined signal level within a predetermined interval of time, the predetermined interval of time being specified by the information expressed by the one or more control bit inputs coupled to the timing generation means.

14. Apparatus as set forth in claim 1 wherein the decoding means further includes delay means for delaying the application of the output of the generating means to the decoding means for compensating for a signal propagation delay between the test pin and a device under test that is coupled to the test pin.

15. Apparatus as set forth in claim 1 wherein each of the words comprised of M bits is generated using $N \leq M$ bits of stored information.

16. Apparatus as set forth in claim 15 wherein M equals four.

17. Apparatus as set forth in claim 1 wherein the storing and outputting means outputs, to the word generating means, stored information that specifies electrical characteristics of an associated test pin for each of a plurality of test cycles, the storing and outputting means further outputting control information for specifying how the word generating means is to interpret the information for determining the state of the M bits for each of the plurality of test cycles.

18. Apparatus as set forth in claim 17 wherein the control information specifies that the information is to be interpreted as an algorithmic test instruction.

19. Apparatus as set forth in claim 17 wherein the stored information outputted to the word generating means is comprised of 32 bits, wherein the control information is comprised of four bits, wherein each of the words comprised of M bits is generated using $N \leq M$ bits of the stored information, and wherein M is equal to four bits.

20. A method of operating a test system having a plurality of test pins, for each of the test pins the method comprising the initial steps of:
    storing a plurality of test patterns and commands within a test pattern storage means; and
    storing a plurality of first control words within a first control word storage means and a plurality of second control words within a second control word storage means, the plurality of first control words each containing a plurality of bits for controlling an operation of a test pin driver means, and the plurality of second control words each containing a plurality of bits for controlling an operation of a test pin receiver means, each of the first and second control word storage means being responsive to the stored test patterns and commands for outputting at least one of the stored controlled words in response thereto.

21. A method as set forth in claim 20 and, during an execution of a test defined by the stored test patterns and commands, the method further includes the steps of:
    accessing the test pattern storage means to extract test pattern and command data in multiples of N bits per cycle therefrom;
    applying the extracted data to an input of a pattern processor means such that a test pattern having M bits per cycle is produced at an output;
    applying the M bits of data to an input of the first control word storage means and to an input of the second control word storage means for selecting a previously stored one of the control words to be output therefrom, the control word being output by each of the first and the second control word storage means having a plurality of control bits that is greater than M; and
    controlling an operation of the test pin driver means with the control word output by the first control memory means, and controlling an operation of the test pin receiver means with the control word output by the second control memory means.

22. A method as set forth in claim 21 wherein N is a variable and wherein M is a constant.

23. A method as set forth in claim 21 wherein N is equal to or less than four and wherein M is equal to four.

24. A method as set forth in claim 21 wherein the step of controlling an operation of the test pin driver means controls a logical state of the test pin driver means, a pulse format of the test pin driver means, a voltage magnitude and polarity of the test pin driver means, and/or whether the test pin driver means is in an "on" state, an "off" state, or in a third state.

25. A method as set forth in claim 21 wherein the step of controlling an operation of the test pin receiver means controls an expected logical state of the test pin at a specific point in a test cycle, controls a magnitude of a voltage threshold associated with the test pin receiver means, controls a time at which an output of the test pin receiver means is sampled and/or controls the position of a timing window wherein the output of the test pin receiver means is tested for an occurrence of a signal excursion.

26. A method as set forth in claim 21 wherein the step of applying the M bits of data to an input of the second control word storage means includes a step of delaying the application of the M bits of data to compensate for a signal propagation delay between the test pin and a device under test that is coupled to the test pin.

27. A test system having a plurality of test pins, for each of the test pins the system comprising:
    first storage means for storing information specifying a state of a test pin for individual ones of a plurality of test cycles;
    second storage means, having an input coupled to an output of the first storage means and responsive to stored information output therefrom, for outputting a word at an output thereof for each of the test cycles, each of the words being comprised of M bits;
    first decoding means, having an input coupled to an output of the second storage means, for decoding one of the M-bit words into one of $2^M$ control words, each of which includes a plurality of control bits, predetermined ones of the plurality of control bits being coupled to pin driver means for specifying, for each of the test cycles, at least one operating characteristic thereof;
    second decoding means, having an input coupled to an output of the second storage means, for decoding each of the M-bit words into one of $2^M$ control words each of which includes a plurality of control bits, predetermined ones of the plurality of control bits being coupled to pin receiver means for specifying, for each of the test cycles, at least one operating characteristic thereof; and
    delay means, interposed between the input of the second decoding means and the output of the second storage means, for delaying the receipt of the M-bit word by the second decoding means, with respect to the receipt of the M-bit word by the first decoding means, by a period of time sufficient to accommodate at least a response time of a device that is coupled to the test pin.

28. A test system as set forth in claim 27 and further comprising control means having an output coupled to an input of the first storage means, to an input of the second storage means, to an input of the first decoding means, and to an input of the second decoding means for storing information therein prior to the execution of test cycles by the test system.

29. A test system as set forth in claim 27 wherein the first storing means further outputs control information for specifying to the second storing means how the second storing means is to interrupt the stored information output by the first storing means, thereby determining a state of the M-bits for each of the test cycles.

30. A test system as set forth in claim 29 wherein the control information specifies that the stored information output by the first storing means is to be interposed as an algorithmic test instruction.

31. Apparatus for controlling an operation of a test pin of a semiconductor device test system, comprising:

means for storing and for outputting information related to a state of the test pin for individual ones of a plurality of consecutive test cycles;

means, having an input coupled to the storing means, for generating words at an output thereof for each of the test cycles, each of the words being comprised of M bits of stored data; and means, having an input coupled to the output of the generating means, for decoding each of the words into one of $2^M$ control words each of which includes a plurality of control bits, predetermined ones of the plurality of control bits being coupled to pin driver means for specifying, for each of the test cycles, at least one characteristic of an electrical signal transmitted to the test pin;

wherein the storing and outputting means outputs, to the word generating means, stored information that specifies electrical characteristics of an associated test pin for each of a plurality of test cycles, the storing and outputting means further outputting control information for specifying how the word generating means is to interpret the information for determining the state of the M bits for each of the plurality of test cycles.

* * * * *